(12) United States Patent
Kim

(10) Patent No.: US 7,262,122 B2
(45) Date of Patent: Aug. 28, 2007

(54) METHOD OF FORMING METAL LINE IN SEMICONDUCTOR MEMORY DEVICE

(75) Inventor: Wan Soo Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 135 days.

(21) Appl. No.: 11/146,171

(22) Filed: Jun. 6, 2005

(65) Prior Publication Data

US 2006/0088991 A1    Apr. 27, 2006

(30) Foreign Application Priority Data

Oct. 21, 2004    (KR) ...................... 10-2004-0084475

(51) Int. Cl.
*H01L 21/44*    (2006.01)
(52) U.S. Cl. ............... 438/597; 438/672; 257/E21.537; 257/E21.577
(58) Field of Classification Search ................ 438/597, 438/672, 674, 675; 257/E21.537, E21.577
See application file for complete search history.

(56) References Cited

U.S. PATENT DOCUMENTS

| 6,294,426 | B1 * | 9/2001 | Tu et al. | 438/255 |
| 6,737,694 | B2 * | 5/2004 | Kim et al. | 257/296 |
| 6,825,082 | B2 * | 11/2004 | Kim et al. | 438/253 |

* cited by examiner

*Primary Examiner*—Michael Lebentritt
*Assistant Examiner*—Stanetta Isaac
(74) *Attorney, Agent, or Firm*—Marshall, Gerstein & Borun LLP

(57) ABSTRACT

The present invention relates to a method of forming a metal line of a semiconductor memory device. According to the present invention, after a drain contact plug formed within an interlayer insulating film protrudes, a nitride film is formed on the top of the drain contact plug, and a trench etch process is then performed using the nitride film as an etch-stop layer. Therefore, loss of the interlayer insulating film formed between a source contact plug and a metal line can be prevented, and generation of a short circuit between the metal line and the source contact plug can also be prevented.

10 Claims, 11 Drawing Sheets

METHOD OF FORMING METAL LINE IN SEMICONDUCTOR MEMORY DEVICE

BACKGROUND

1. Field of the Invention

The present invention relates to a method of forming a metal line of a semiconductor memory device, and more specifically, to a method of forming a metal line of a semiconductor memory device, wherein generation of malfunction, which is caused due to a bridge generating between a metal line electrically connected to a drain contact plug, and a source contact plug, can be prevented.

2. Discussion of Related Art

Generally, in semiconductor memory devices, as wiring technology for forming a metal line, technologies in which a conductive film is deposited on an insulating film and is then patterned to form a metal line by means of a photolithography process and an etch process has been widely used.

This metal line serves to transfer an externally applied driving voltage (bias voltage) to an underlying semiconductor structure layer. In order to electrically connect the metal line and a predetermined semiconductor structure layer, a contact plug is needed.

In NAND flash memory devices of the semiconductor memory devices, a source contact plug (SRCT) and a drain contact plug (DRCT) are formed as contact plugs. The source contact plug serves to connect a source region and a predetermined metal line, and the drain contact plug electrically connects a drain region and a predetermined metal line.

Hereinafter, a conventional method of forming a metal line of a NAND flash memory device will be described with reference to FIGS. 1a to 1h, and FIGS. 2a to 2f. In this case, FIGS. 1a to 1h are cross-sectional views taken in a Y axis (a bit line direction), and FIGS. 2e to 2f are cross-sectional views taken in an X axis (a word line direction).

Referring to FIG. 1a, a semiconductor substrate 10 in which a gate electrode 16, and a source and drain region (not shown) are formed is provided. In this case, it is assumed that the gate electrode 16 includes a tunnel oxide film 11, a floating gate 12, a dielectric film 13, a control gate 14 and a conductive layer 15 for convenience of explanation.

Spacers 17 are formed on both sidewalls of the gate electrode 16. A nitride film 18 and an interlayer insulating film 19 (hereinafter, referred to as "first interlayer insulating film") are then formed on the entire structure including the spacers 17 in a sequential manner. The first interlayer insulating film 19 is then polished.

Referring to FIG. 1b, a source contact mask (not shown) is formed. The first interlayer insulating film 19 is etched by means of an etch process using a source contact mask by using the nitride film 18 as an etch-stop layer. A strip process and a cleaning process are then performed to remove the nitride film 18, which is exposed through the patterned first interlayer insulating film 19, while removing the source contact mask, thereby forming a source contact hole 20 through which the source region is exposed.

Referring to FIG. 1c, a source contact plug 21 connected to the source region is formed so that the source contact hole 20 is gap-filled. An interlayer insulating film 22 (hereinafter, referred to as "second interlayer insulating film") is then formed on the entire structure including the source contact plug 21.

Referring to FIGS. 1d and 2a, a drain contact mask (not shown) is formed on the second interlayer insulating film 22. An etch process using the drain contact mask is implemented to remove the second interlayer insulating film 22 and the first interlayer insulating film 19, thus forming a drain contact hole (not shown) through which the drain region is exposed. Thereafter, after a conductive layer for a drain contact plug is deposited so that the drain contact hole is gap-filled, a polishing process is performed to form a drain contact plug 23.

In this case, the second interlayer insulating film 22 is recessed in a predetermined thickness by means of the polishing process, and a thickness of the second interlayer insulating film 22 becomes thin accordingly.

Referring to FIGS. 1e and 2b, a nitride film 24 is formed on the entire structure including the drain contact plug 23.

Referring to FIGS. 1f and 2c, an insulating film 25 (hereinafter, referred to as "third interlayer insulating film") is deposited on the nitride film 24.

Referring to FIGS. 1g and 2d, after a trench mask 26 is formed, an etch process using the trench mask 26 is performed to pattern the third interlayer insulating film 25.

Referring to FIG. 2e, a cleaning process is implemented to remove the nitride film 24, which was used as the etch-stop layer in the etch process. Thereby, a trench 27 through the drain contact plug 23 is exposed is formed.

Referring to FIGS. 1h and 2f, after a conductive layer is deposited on the entire structure so that the trench 27 is gap-filled, a polishing process is performed to form a metal line 28 that is electrically connected to the drain contact plug 23.

In the conventional method of forming the metal line of the NAND flash memory device, which has been described with reference to FIGS. 1a to 1h and FIGS. 2a to 2f, the thickness of the second interlayer insulating film 22 that provides electrical insulation between the metal line 28 and the source contact plug 21 is reduced twice. As shown in FIGS. 1d and 2a, in the polishing process for forming the drain contact plug 23, the thickness is firstly reduced. Next, the thickness is secondly reduced by means of over-etch (see 'A' in FIG. 2e) that is performed so as to remove residue, which is generated in the removal process of the nitride film 24 for forming the trench 27 in FIGS. 1g and 2e.

As such, if the thickness of the second interlayer insulating film 22 reduces, a bridge is formed between the metal line 28 and the source contact plug 21. This is because the thickness of the second interlayer insulating film 22, which provides electrical insulation between the metal line 28 and the source contact plug 21, becomes thin. The drain contact plug 23 and the source contact plug 21 are typically formed parallel to each other, and the metal line 28 intersects the top of the source contact plug 21 at an angle of 90° with the second interlayer insulating film 22 therebetween. This is because if the thickness of the second interlayer insulating film 22 reduces, a bridge is generated between the metal line 28 and the source contact plug 21. This makes fragile insulation margin between the source contact plug 21 and the metal line 28. Thus, if a bridge is generated between the source contact plug 21 and the metal line 28, a device operate erroneously.

SUMMARY OF THE INVENTION

Accordingly, the present invention has been made in view of the above problems, and it is an object of the present invention to provide a method of forming a metal line of a semiconductor memory device, wherein a short circuit, which is generated due to a bridge between a metal line electrically connected to a drain contact plug and a source contact plug, can be prevented.

To achieve the above object, according to an aspect of the present invention, there is provided a method of forming a metal line of a semiconductor memory device, including the steps of providing a semiconductor substrate in which a source contact plug is formed in a source contact hole of a first interlayer insulating film, forming a second interlayer insulating film on the semiconductor substrate, patterning the second interlayer insulating film by performing an etch process using a drain contact mask, thus forming a drain contact hole through a drain region formed within the semiconductor substrate, forming a drain contact plug to bury the drain contact hole, recessing the second interlayer insulating film through a first etch process, so that the drain contact plug protrudes, depositing a nitride film along the topography on the entire structure including the drain contact plug, forming a third interlayer insulating film on the nitride film, patterning the third interlayer insulating film so that the nitride film formed on the protruded portion of the drain contact plug is exposed, thereby forming a trench, performing a second etch process to strip the nitride film exposed through the trench, thus exposing the drain contact plug, and forming a metal line to bury the trench.

DETAILED DESCRIPTION OF PREFERRED EMBODIMENTS

Now, the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

FIGS. 3a to 3g and FIGS. 4a to 4f are cross-sectional views for explaining a method of forming a metal line of a semiconductor memory device according to a preferred embodiment of the present invention. In this case, for example, a NAND flash memory device is taken as an example. FIGS. 3a to 3g are cross-sectional views taken in a Y axis (a bit line direction), and FIGS. 4a to 4f are cross-sectional views taken in an X axis (a word line direction).

Figure 1A:
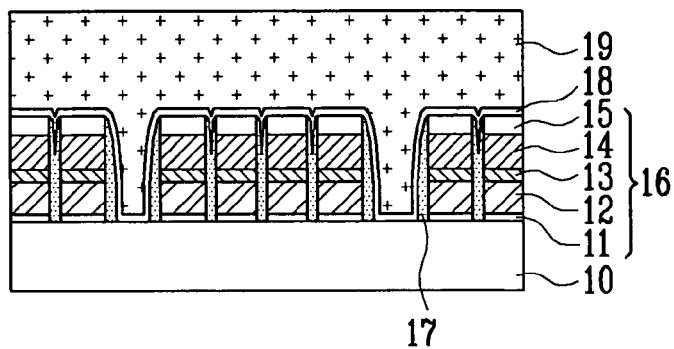
FIGS. 1a to 1h and FIGS. 2a to 2f are cross-sectional views for explaining a method of forming a metal line of a NAND flash memory device in the prior art.
Figure 1B:
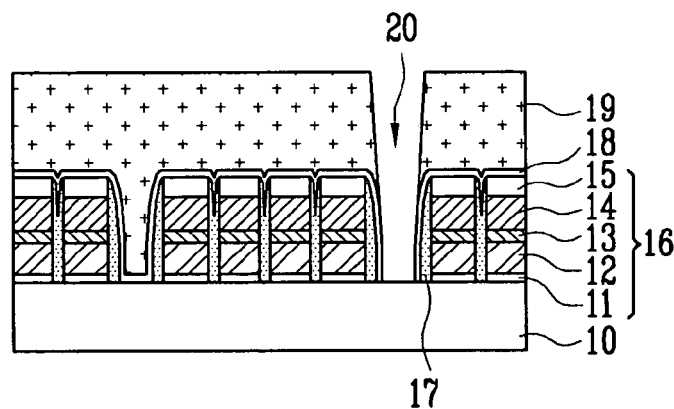
Figure 1C:
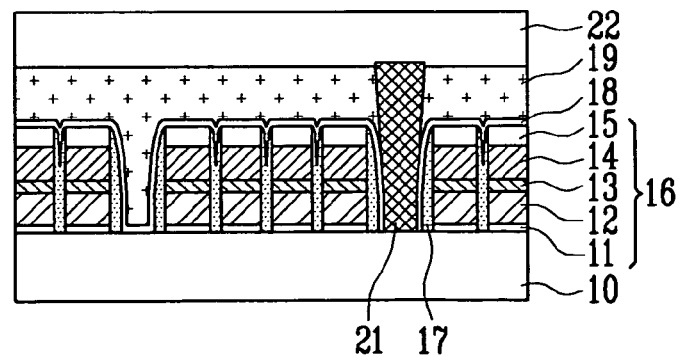
Figure 1D:
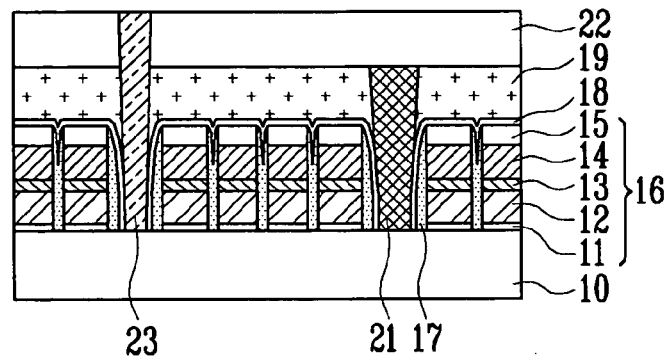
Figure 1E:
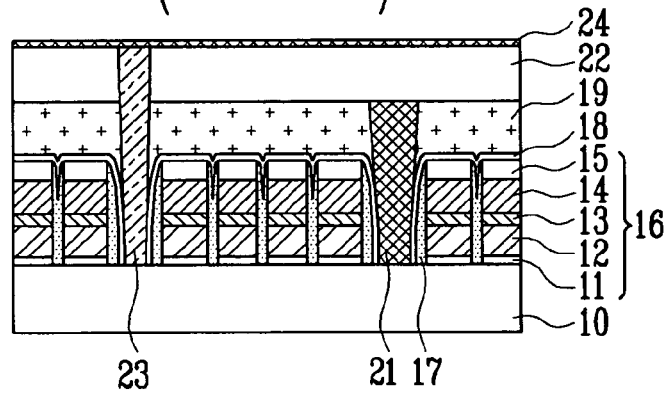
Figure 1F:
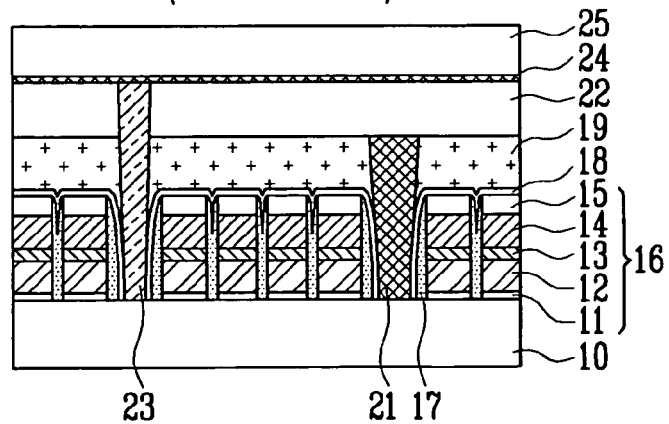
Figure 1G:
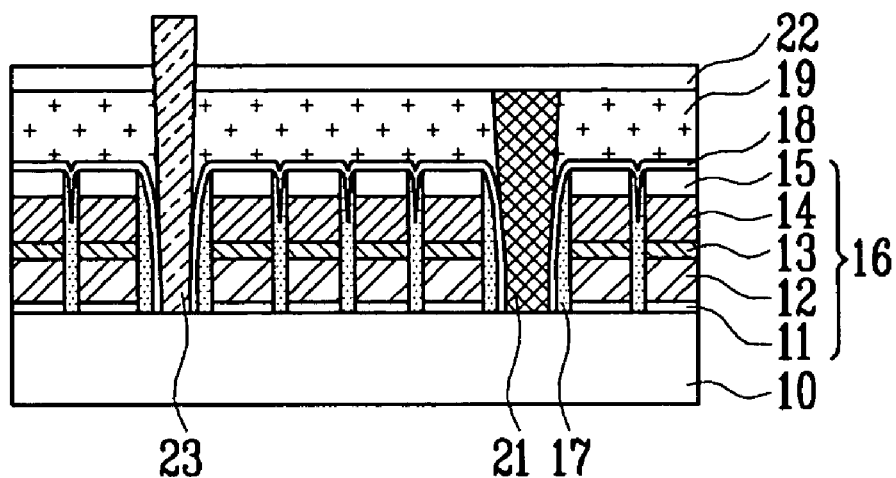
Figure 1H:
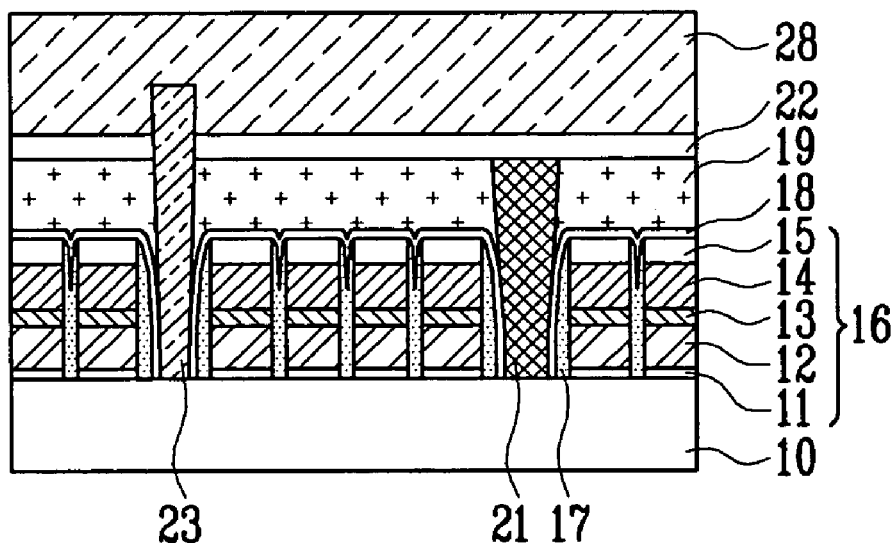
Figure 2A:
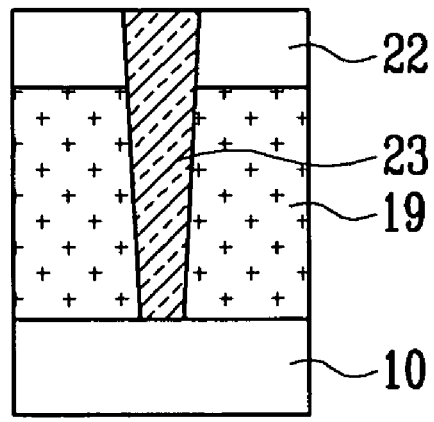
Figure 2B:
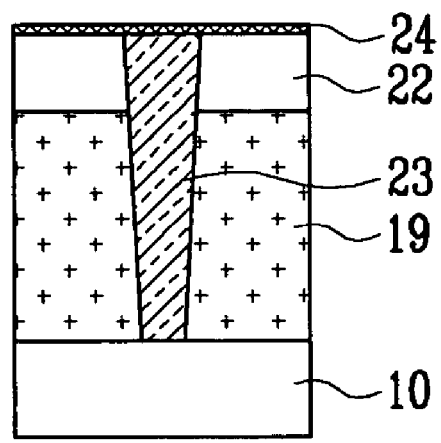
Figure 2C:
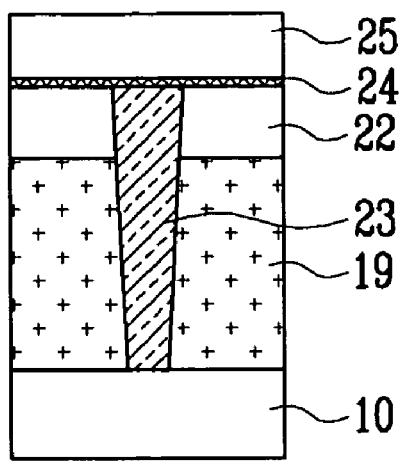
Figure 2D:
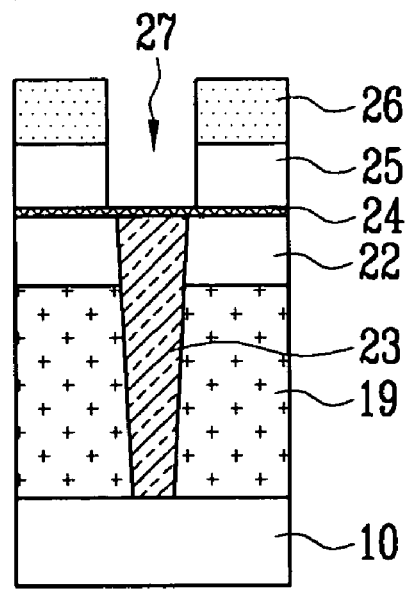
Figure 2E:
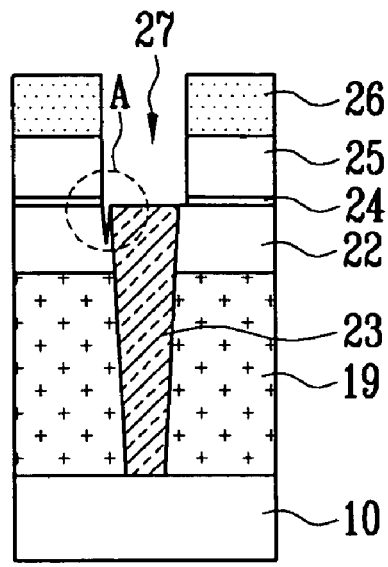
Figure 2F:
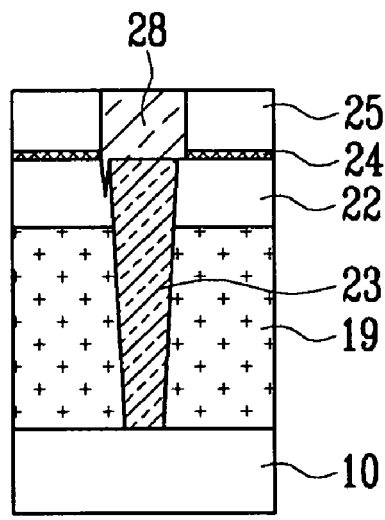
Figure 3A:
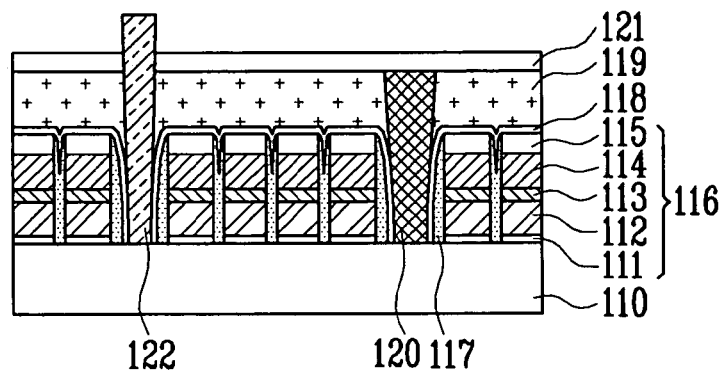
FIGS. 3a to 3g and FIGS. 4a to 4f are cross-sectional views for explaining a method of forming a metal line of a semiconductor memory device according to a preferred embodiment of the present invention.
Figure 4A:
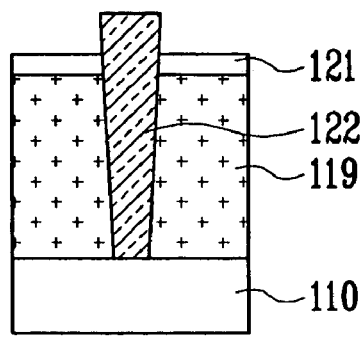

Referring to FIGS. 3a and 4a, a semiconductor substrate 110 in which a gate electrode 116, and a source and drain region (not shown) are formed is provided. In this case, it is assumed that the gate electrode 116 includes a tunnel oxide film 111, a floating gate 112, a dielectric film 1113, a control gate 114 and a conductive layer 115 for convenience of explanation. In this case, the conductive layer 115 can be formed using a tungsten silicide layer.

Thereafter, spacers 117 are formed on both sidewalls of the gate electrode 116.

An insulating film 118 is then formed along the step on the entire structure including the spacers 117. In this case, the insulating film 118 is preferably formed using a nitride film having a high etch selective ratio against the first interlayer insulating film 119 in an etch process so that it can serve as an etch-stop layer.

A first interlayer insulating film 119 is then formed on the insulating film 118. In this case, the first interlayer insulating film 119 is preferably formed using a high-density plasma (HDP) oxide film having good gap-filling characteristics.

In this case, the first interlayer insulating film 119 is formed to a thickness of 5000 to 10000 Å. Meanwhile, the first interlayer insulating film 119 can be formed using one of a BPSG (Boron Phosphorus Silicate Glass) film, an USG (Undoped Silicate Glass) film, a TEOS (Tetra Ethyl Ortho Silicate) film and a SOG (Spin On Glass), or a stack structure of them.

Thereafter, a polishing process using a CMP (Chemical Mechanical Polishing) process is performed to polish the first interlayer insulating film 119.

After a source contact mask (not shown) is formed on the first interlayer insulating film 119, an etch process using the source contact mask is implemented to form a source contact hole (not shown).

A strip process is then performed to remove the source contact mask, and a cleaning process is also performed to remove remaining impurity.

Thereafter, a source contact plug 120 is formed so that the source contact hole is gap-filled. In this case, the source contact plug 120 can be formed by depositing a polysilicon film on the entire structure so that the source contact hole is gap-filled, and then performing a polishing process using CMP process or etch-back process.

A second interlayer insulating film 121 is then formed on the entire structure including the source contact plug 120. In this case, the second interlayer insulating film 121 can be formed to a thickness of 1500 to 3500 Å by using a PE (Plasma Enhanced)-TEOS film or HDP (High Density Plasma) oxide film.

Thereafter, a drain contact mask (not shown) is formed on the second interlayer insulating film 121.

An etch process using the drain contact mask is then performed to each the second interlayer insulating film 121 and the first interlayer insulating film 119, thereby forming a drain contact hole (not shown) through which the drain region is exposed.

A conductive layer (not shown) for the drain contact plug is then deposited so that the drain contact hole is gap-filled. In this case, the conductive layer for the drain contact plug is preferably formed using a polysilicon film, or a conductive layer such as tungsten, copper or aluminum.

Thereafter, a polishing process using CMP process or etch-back process is carried out to polish the conductive layer for the drain contact plug. In this case, the polishing process is performed so that an etch selective ratio between the second interlayer insulating film 121 and the conductive layer for the drain contact plug, i.e., polysilicon becomes 1:1. Thereby, a drain contact plug 122 in which the drain contact hole is buried is formed.

Next, in order for some of a top surface of the drain contact plug 122 to protrude, an etch process of dry or wet mode is performed to recess the second interlayer insulating film 121. In this case, the degree that the drain contact plug 122 protrudes is preferably 300 to 1000 Å. Furthermore, the etch process is preferably performed under a recipe condition in which the etch rate of the second interlayer insulating film 121 is faster than that of the drain contact plug 122 (at least 3 times or more). For example, in the case where the etch process of wet mode is performed, a BOE Buffer (Oxide Etchant) or DHF (Diluted HF) solution is used. For example, if the second interlayer insulating film 121 is formed of the PE-TEOS film, the BOB solution may use a mixed solution of HF and NH$_4$F diluted with H$_2$O at the ratio of 100:1 to 9:1, or HF diluted with H$_2$O at the ratio of 100:1 to 50:1.

Figure 3B:
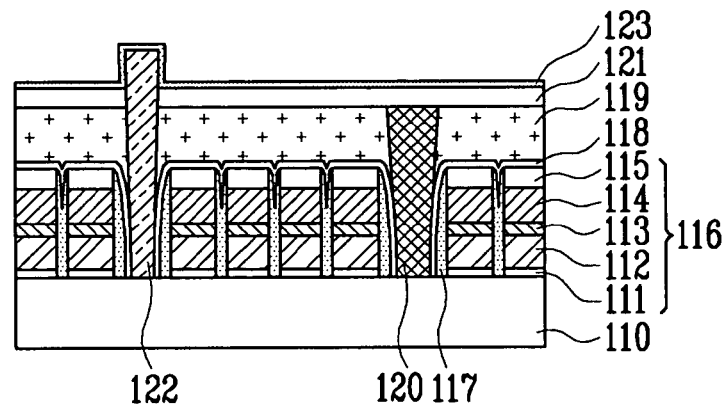
Figure 3C:
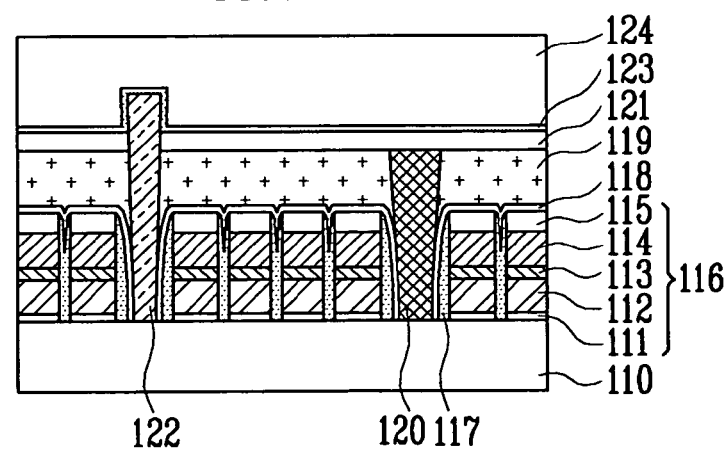
Figure 3D:
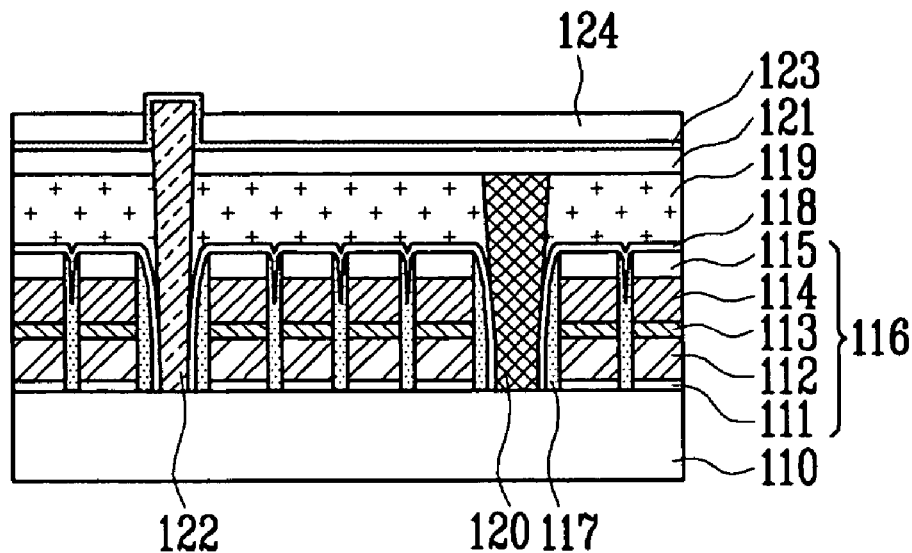
Figure 3E:
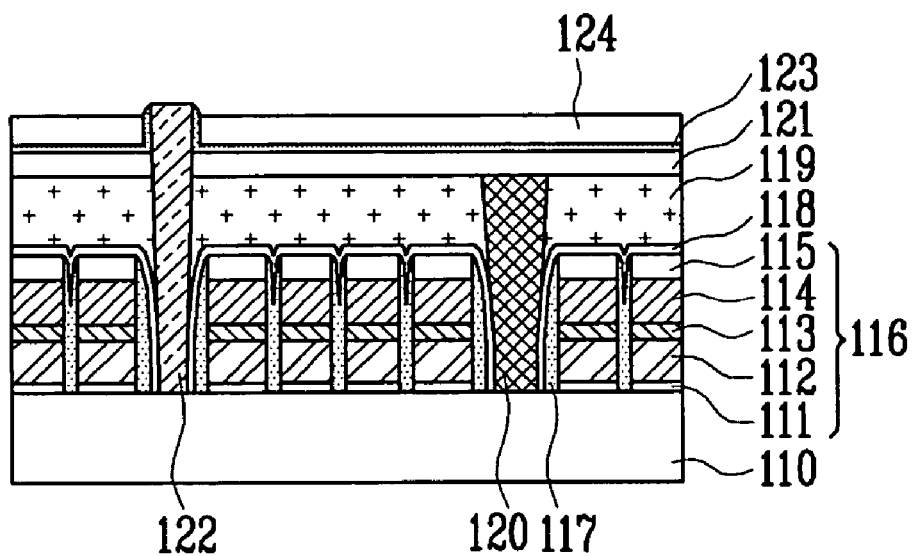
Figure 3F:
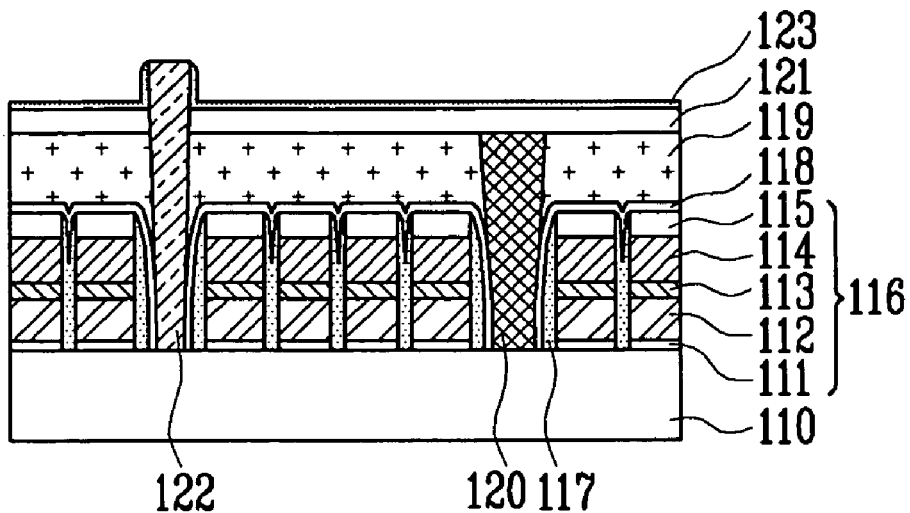
Figure 3G:
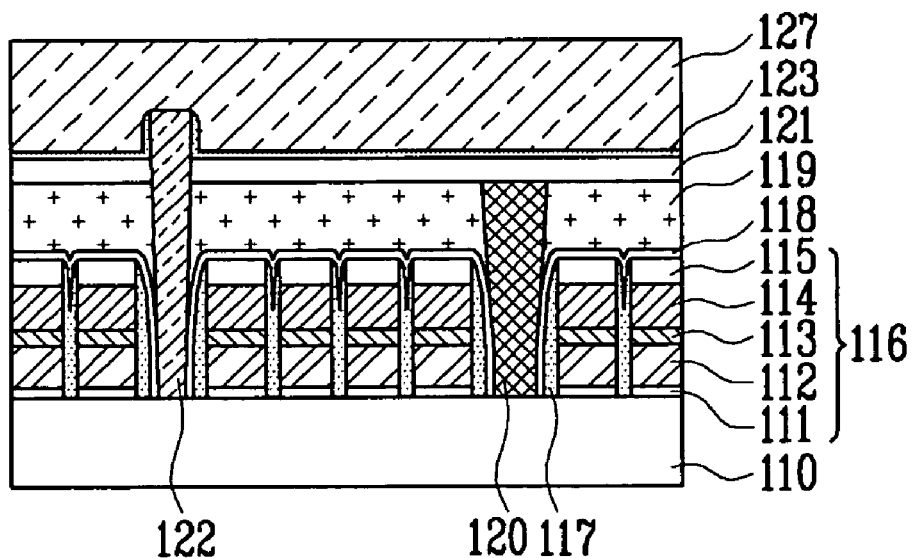

Meanwhile, the reason why the drain contact plug 122 protrudes is that an insulation margin of the source contact plug 120 and a metal line 127 can be secured in FIG. 3g by a thickness that the drain contact plug 122 protrudes. That is, a thickness of the second interlayer insulating film 124, which remains between the source contact plug 120 and the metal line 127 by the thickness that the drain contact plug 122 protrudes, is decided.

Figure 4B:
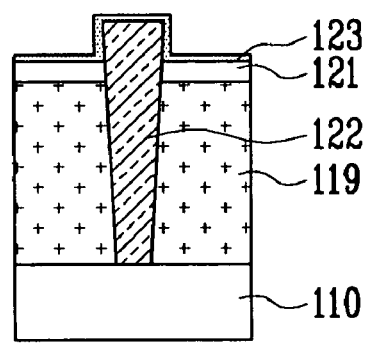

Referring to FIGS. 3b and 4b, a nitride film 123 is deposited along the topography on the entire structure including the drain contact plug 122, which partially protrudes. In this case, the nitride film 123 can be deposited to a thickness of 300 to 500 Å using a LP (Low Pressure)-nitride film or a PE (Plasma Enhanced)-nitride film.

Figure 4C:
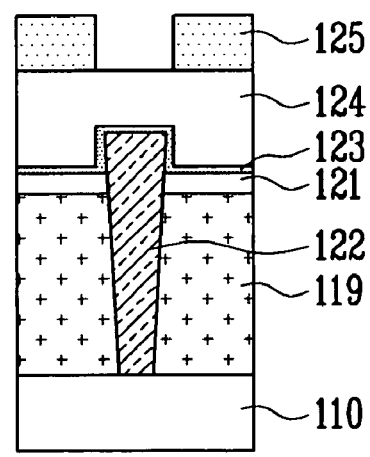

Referring to FIGS. 3c and 4c, a third interlayer insulating film 124 is deposited on the nitride film 123. In this case, the third interlayer insulating film 124 is deposited to a thickness of 1000 to 3000 Å using a PE-TEOS film. In this case, the reason why the PE-TEOS film is used is that it has better polishing characteristics than other films.

Thereafter, a trench mask 125 is formed on the third interlayer insulating film 124. In this case, the trench mask 125 is formed by a photolithography process. That is, after a photoresist is coated on the third interlayer insulating film 124, the trench mask 125 is formed by means of exposure and development processes using the photomask.

Meanwhile, though not shown in the drawings, before the trench mask 125 is formed, an anti-reflection film (BARC) can be formed on the third interlayer insulating film 124.

Figure 4D:
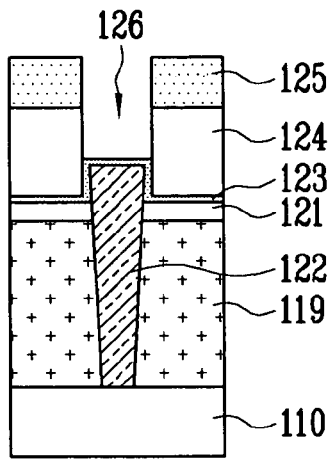

Referring to FIGS. 3d and 4d, a trench 126 is formed by means of an etch process using the trench mask 125. In this case, in the etch process, the trench 126 can be formed by firstly etching some of the anti-reflection film and the third interlayer insulating film 124, and secondly etching the remaining third interlayer insulating film 124 under a recipe condition in which an etch selective ratio with the nitride film 123 is high, so that the nitride film 123 formed on the protruded portion of the drain contact plug 122 is exposed. For example, a gas having a high etch selective ratio may include a mixed gas of C$_4$F$_8$/CH$_2$F$_2$/Ar or a mixed gas of C$_4$F$_6$/Ar/O$_2$. Furthermore, the etch process is preferably performed in such a way that the third interlayer insulating film 124 remains about 300 to 1000 Å in thickness on the basis of the nitride film 123 formed on the protruded portion of the drain contact plug 122.

Meanwhile, it has been shown in FIGS. 3d and 4d that after the trench 126 is formed, the thickness of the third interlayer insulating film 124 varies. This is because the thickness of the third interlayer insulating film 124 can vary depending upon a cutting location. The third interlayer insulating film 124 in a cross section taken in a Y-axis direction as shown in FIG. 4d remains thicker than that taken in a X-axis direction as shown in FIG. 3d.

Figure 4E:
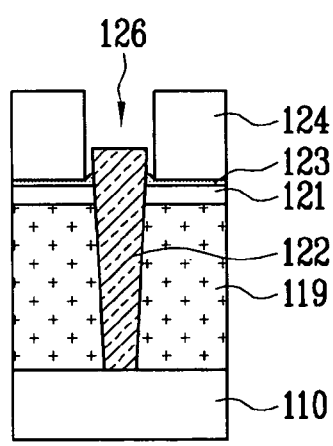

Referring to FIGS. 3e and 4e, a strip process is performed to remove the trench mask 125.

Impurities remaining on a top surface of the nitride film 123 and the third interlayer insulating film 124 can be stripped by performing a cleaning process using a DHF or BOE solution.

An etch process is then performed to remove the nitride film 123 exposed through the trench 126. In this case, the etch process can be performed in dry or wet mode. For instance, the dry mode can be performed using a mixed gas of CF$_4$, CHF$_3$, O$_2$, Ar, etc. The wet mode can be performed using a H$_3$PO$_4$ solution at an etch rate of about 40 to 60 Å/min. Moreover, the etch process is preferably performed in such a manner that the third interlayer insulating film 124 deposited around the drain contact plug 122 is recessed from the top of the nitride film 123 in thickness of 200 to 300 Å. The top of the protruded portion of the drain contact plug 122 is exposed by means of the etch process.

Referring to FIG. 3f, the third interlayer insulating film 124 remaining on the nitride film 123 can be stripped by means of an etch process using the nitride film 123 as an etch-stop layer. In this case, the etch process for stripping the third interlayer insulating film 124 is optional. This can be properly changed depending upon the height of a metal line. For example, in order to increase the height of the metal line, it is preferred that the third interlayer insulating film 124 is stripped.

Figure 4F:
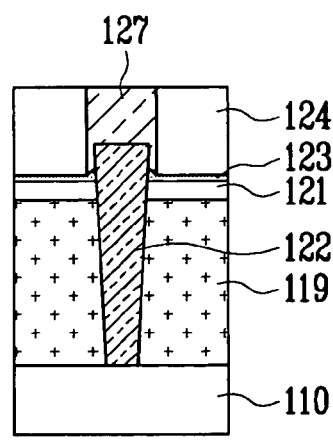

Referring to FIGS. 3g and 4f, a conductive layer is deposited on the entire structure so that the trench (see '126' of FIG. 4e) is gap-filled. In this case, the conductive layer can be one of a polysilicon film, copper, tungsten and aluminum.

Thereafter, a polishing process using CMP process or etch-back process is performed to form a metal line 127 that is electrically connected to the drain contact plug 122 so that the trench is buried.

As described above, according to the present invention, after a drain contact plug formed within an interlayer insulating film protrudes, a nitride film is formed on the top of the drain contact plug, and a trench etch process is then performed using the nitride film as an etch-stop layer. Loss of the interlayer insulating film formed between a source contact plug and a metal line can be prevented, and generation of a short circuit between the metal line and the source contact plug can also be prevented. It is thus possible to prevent malfunction of semiconductor memory devices.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method of forming a metal line of a semiconductor memory device, comprising the steps of:

providing a semiconductor substrate in which a source contact plug is formed in a source contact hole of a first interlayer insulating film;

forming a second interlayer insulating film on the semiconductor substrate;

patterning the second interlayer insulating film by performing an etch process using a drain contact mask, thus forming a drain contact hole through a drain region formed within the semiconductor substrate;

forming a drain contact plug to bury the drain contact hole;

recessing the second interlayer insulating film through a first etch process, so that the drain contact plug protrudes;

depositing a nitride film along the topography on the entire structure including the drain contact plug;

forming a third interlayer insulating film on the nitride film;

patterning the third interlayer insulating film so that the nitride film formed on the protruded portion of the drain contact plug is exposed, thereby forming a trench;

performing a second etch process to strip the nitride film exposed through the trench, thus exposing the drain contact plug; and forming a metal line to bury the trench.

2. The method as claimed in claim 1, wherein the first etch process is set to a condition in which an etch rate of the second interlayer insulating film is at least three times faster than that of the drain contact plug.

3. The method as claimed in claim 1, wherein the first etch process is performed using a BOE or DHF solution.

4. The method as claimed in claim 3, wherein the BOE solution uses a mixed solution of HF and $NH_4F$ diluted with $H_2O$ at the ratio of 100:1 to 9:1 in the case where the second interlayer insulating film is formed using a PE-TEOS film.

5. The method as claimed in claim 3, wherein the DHF solution uses HF diluted with $H_2O$ at the ratio of 100:1 to 50:1 in the case where the second interlayer insulating film is formed using a PE-TEOS film.

6. The method as claimed in claim 1, wherein the drain contact plug protrudes about 300 to 100 Å in thickness.

7. The method as claimed in claim 1, wherein the second etch process is performed in a dry or a wet mode.

8. The method as claimed in claim 7, comprising performing the second etch process in the dry mode using a mixed gas including $CF_4$, $CHF_3$, $O_2$ and Ar gases.

9. The method as claimed in claim 7, comprising performing the second etch process in the wet mode at an etch rate of about 40 to 60 Å/min using a $H_3PO_4$ solution.

10. The method as claimed in claim 1, wherein the etch process is performed in such a manner that the third interlayer insulating film deposited around the drain contact plug is recessed from the top of the nitride film in thickness of 200 to 300 Å.

* * * * *